July 11, 1961

L. R. KAHN 2,992,326

FREQUENCY TRANSLATING CIRCUITRY

Filed Aug. 10, 1959

INVENTOR.
LEONARD R. KAHN

BY Mathis and Graybeal

ATTORNEYS 2,992,326
FREQUENCY TRANSLATING CIRCUITRY
Leonard R. Kahn, 81 S. Bergen Place, Freeport, N.Y.
Filed Aug. 10, 1959, Ser. No. 832,561
7 Claims. (Cl. 250—6)

The present invention relates to electronic circuitry for generating electromagnetic energy at a particular selected frequency, and more particularly relates to frequency translation circuitry.

One of the most basic problems in electronics circuit design has been the evolution of various circuits for combining two frequencies to produce a new frequency. Frequency translation, i.e. generation of a desired frequency from two other frequencies, presents many problems in terms of elimination of spurious frequencies, energy efficiency, stability, etc.

One of the most common techniques for accomplishing frequency translation is to mix or heterodyne two signals of differing frequencies in some type of non-linear device so as to produce sum and difference components, one of which components is then selected by a band-pass filter, or the like. When such a mixing technique is used in frequency translation, either a large number of filters are required or some way of tuning must be provided in order to isolate the desired component energy at the particular frequency desired. Phase shift techniques of sideband generation have also been employed for isolating one component frequency, but such techniques require special wideband phase shift devices.

Fundamentally, the present invention offers new techniques and associated circuitry for frequency synthesis, without complex circuit requirements, and without substantial spurious frequency energy. The present invention also provides advantageous and simple circuitry for obtaining a reconditioned carrier frequency in a suppressed carrier system.

These and other objects, features and advantages of my invention will be apparent from a consideration of the following description, and the accompanying drawings, wherein.

Figure 1:
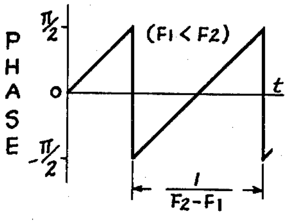
FIG. 1 illustrates a phase modulated wave of saw tooth shape resulting from limiting a signal made up of two different frequencies of substantially equal amplitude, the reference frequency ($F_1$) being the lower frequency of the two input frequencies $F_1$ and $F_2$.
Figure 2:
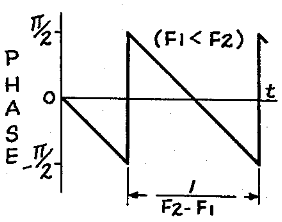
FIG. 2 is a phase modulated wave of saw tooth shape, identical to FIG. 1, but with the frequency ($F_2$) as the reference frequency.

The new frequency generation technique of the present invention is based upon the fact that when a tone wave or signal which has two frequency components of substantially equal amplitude is limited, the resulting phase modulated wave has a saw tooth shape, such as shown in FIGS. 1 and 2. The phase curve of FIG. 1 assumes that the reference or stationary phasor $F_1$ is the lower of the two input frequencies $F_1$ and $F_2$ and the phase curve of FIG. 2 assumes that the reference or stationary phasor is $F_2$, the higher input frequency.

Figure 3:
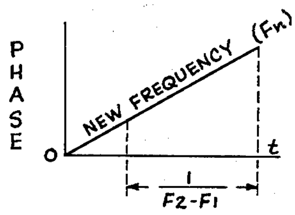
FIG. 3 is a plot of the constant phase slope obtained when phase reversal is applied to the waveform of FIG. 1, the constant phase slope thus obtained representing a new frequency at frequency $$\frac{F_1+F_2}{2}$$

It is to be noted in connection with the waveforms shown by FIGS. 1 and 2 that the slope of the saw tooth wave in each instance is such that the phase gains $\pi$ radians per beat difference cycle. Thus, if $F_1-F_2$ equals one megacycle, the phase would gain $\pi$ radians every microsecond. However, the phase whip negates this gain of $\pi$ radians. Essentially, the circuitry of the present invention reverses the polarity of this wave at the time the phase whip occurs, nullifying the phase whip, whereupon the phase of the wave continues to change in a constant manner, i.e. gives a constant phase slope. The constant phase slope of (cf. FIG. 3) is synonymous with a new frequency $F_n$. This new frequency $F_n$ is $\pi$ radians per beat cycle higher in frequency than $F_1$ and $\pi$ radians per beat cycle less than $F_2$. Thus, $F_n$ is arithmetically half way between $F_1$ and $F_2$, or equal to $$\frac{F_1+F_2}{2}$$

Another way of analyzing the nature of the new frequency is to view the phase modulation component of the two tone wave at $$\frac{F_1+F_2}{2}$$

frequency. The phase slope is nullified and the phase relationship shown at FIG. 3 results after switching. The wave in effect has no phase modulation relative to $$\frac{F_1+F_2}{2}$$

i.e. is merely a sine wave of frequency equal to the arithmetic mean between $F_1$ and $F_2$.

Figure 4:
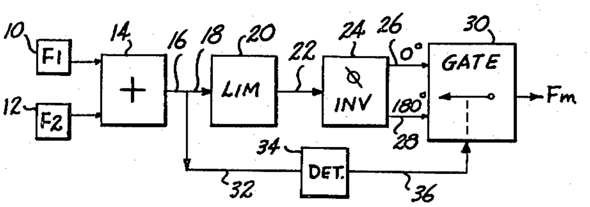
FIG. 4 is a block diagram showing one typical and therefore non-limitive circuit arrangement for practice of the invention.

FIG. 4 is a block diagram of one possible circuit arrangement for accomplishing the characteristic relationship of the present invention. Two equal amplitude tones of different frequencies $F_1$ and $F_2$ are generated in respective signal source or generation means 10 and 12, then fed to a linear summation network 14. Summation network 14 can consist of simply two resistors or two capacitors, functioning as voltage dividers. The combined two equal amplitude tone wave output 16 is then fed, as indicated at 18, to an amplitude limiter 20 where the amplitude modulation component of the signal is eliminated, resulting in a pure phase modulated output 22. This output 22 is fed to a phase inverter 24 which provides two signal outputs of opposite polarity, as indicated at 26 and 28. These two signals 26 and 28 are then fed to a gate circuit 30, which passes either one polarity or the other, according to the controlled keying signal output 32, obtained from output 16 of the linear summation network 14 by envelope detection through a diode detector 34, the output 36 of which is fed to gate 30. Gate 30 can take the form of a synchronized oscillator or multi-vibrator, or a keyed saturable reactor, for example, or even a keyed relay for frequencies permitting such. Functionally, the gate 30 switches polarity between opposite polarity outputs 26 and 28 from phase inverter 24 whenever the amplitude of the two equal amplitude tone signal goes through zero. As will be noted, this is precisely the proper time to reverse polarity in order to counteract the phase whip of the phase modulated wave.

It is important, when using the frequency generation technique of the present invention, to have the frequencies of the two frequencies $F_1$ and $F_2$ separated by a comparatively small percentage. Quantitatively, and as a rule of approximation, the relation of frequency $F_1$ and frequency $F_2$ should be $F_1 \geq 10(F_2-F_1)$. Otherwise, there is danger the envelope detector 34 will not be able to distinguish between the RF signal zero points and the envelope variations.

Figure 5:
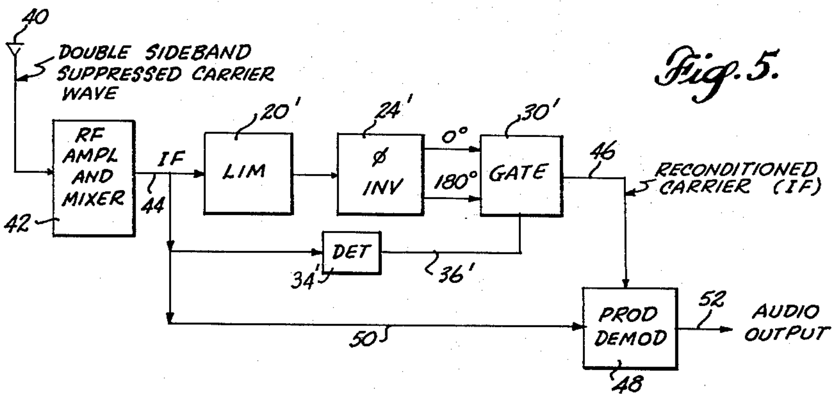
FIG. 5 is a block diagram of a double sideband suppressed carrier receiver, having incorporated therewith a frequency translation circuit according to the present invention, for deriving the reconditioned carrier signal.

FIG. 5 illustrates by block diagram a further type of application of frequency translation circuitry according to the present invention, the utilization in such application being to provide a simple and effective way in which to derive a reconditioned carrier frequency in a receiver for a double sideband suppressed carrier wave. In view of the close identity of the frequency translating circuitry of this application, prime numerals are used to designate like components corresponding to the components of the circuit shown in FIG. 4.

In the double sideband suppressed carrier wave receiver shown in FIG. 5, the incoming double sideband suppressed carrier wave is received by antenna 40, and the IF derived through conventional RF and mixer stages, indicated at 42. A portion of the IF output 44 is fed to limiter 20', thence to phase inverter 24' and to gate 30', with a further portion of the IF signal being detected by envelope detector 34' to generate the keying signal 36' for gate 30'. The output 36' from gate 30' is the reconditioned carrier (IF), which is in turn fed to product demodulator 48 in which a further portion 50 of the IF signal is demodulated to generate an audio output 52.

In the circuitry shown in FIG. 5, it will be noted that such derives a reconditioned carrier (IF) by a frequency translation technique in a manner functionally identical with the frequency transmission technique performed by the circuit of FIG. 4, the two double sidebands of the incoming IF signal corresponding to input frequencies $F_1$ and $F_2$, and the reconditioned carrier (IF) 46 corresponding to the new frequency $F_n$ generated in FIG. 4, the said reconditioned carrier (IF) 46 therefore being at a value which is the arithmetic means between the double sidebands of the input carrier waves, and consequently accurately providing the reconditioned carrier (IF).

Figure 6:
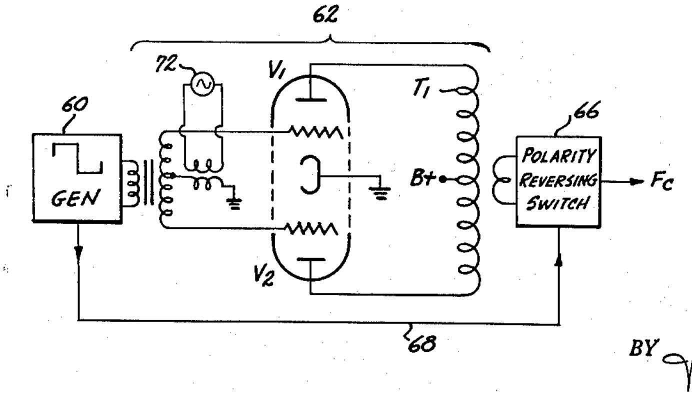
FIG. 6 is a schematic diagram of a circuit to explain by analogy certain characteristics of the present invention, such circuit comprising a square wave generator and a balanced modulator, with a polarity reversing switch keyed by an output from the square wave generator so that the balanced modulator output is translated to energy at a new frequency.

FIG. 6 shows a balanced modulator in conjunction with a square wave generator and a polarity reversing switch to illustrate and prove by analogy certain characteristics of circuitry of the present invention. In FIG. 6, square wave generator 60 modulates the balanced modulator 62, which is conventional per se, producing most of its output from $V_1$ when the square wave voltage from square wave generator 60 is positive, and producing most of its output from $V_2$ when the square wave from square wave generator 60 is negative. Since the plates of tubes $V_1$ and $V_2$ are connected to opposite ends of transformer $T_1$, then the phase of the output wave 64 reverses when the square wave input polarity reverses. If a perfectly balanced square wave input is used, the positive and negative excursions of the square wave are equal, i.e. assuming perfect symmetry, the RF output amplitude is constant.

The spectrum of a double-sideband suppressed carrier signal is calculable by using Fourier series representation of the input square wave and adding and subtracting each modulation component to the suppressed carrier frequency. Such an analysis shows this symmetrical double-sideband suppressed carrier wave to be identical to a limited, two equal tone wave shown in Proc. I.R.E. issue of December 1956, at page 1711.

If the output 64 of balanced modulator 62 is fed through transformer $T_1$ to a polarity reversing switching circuit 66, keyed by a synchronized input 68 from square wave generator 60, then the effect of the balanced modulator is nullified. By action of the keyed polarity reversing switch 66, the output $F_c$ from the circuit is a sine wave at a frequency the same as the frequency generated by carrier generator 72.

From the foregoing consideration of typical and therefore non-limitive embodiments of circuitry incorporating the present invention, various further forms, modifications, and rearrangements as well as fields of application thereof will occur to those skilled in the art, within the scope of the following claims.

What is claimed is:

1. Frequency generating means comprising means generating a first frequency $F_1$, means generating a second frequency $F_2$, means combining said frequencies producing a two tone signal, means amplitude limiting said two tone signal and producing a phase modulated signal of substantially constant amplitude, and means gating such phase modulated signal in a manner nullifying the abrupt phase reversals thereof and producing as an output from such gating means a new frequency $F_n$ equal to $$\frac{F_1+F_2}{2}$$

2. Frequency generating means according to claim 1, wherein $F_1$ is at least equal to $10\,(F_2-F_1)$.

3. A frequency synthesizing circuit comprising means generating a first frequency $F_1$, means generating a second frequency $F_2$ substantially equal in amplitude to said first frequency $F_1$, means summatively combining said frequencies $F_1$ and $F_2$, means limiting the mixed signal and producing a phase modulated signal at substantially constant amplitude, means inverting such phase modulated signal, and means gating the inverted phase modulated signal in synchronism with the occurrence of abrupt phase reversals in the mixed signal, such gating means functioning to nullify such abrupt phase reversals and generate as an output a new frequency $F_n$ a frequency equal to $$\frac{F_1+F_2}{2}$$

4. In a frequency synthesizing circuit, means generating and combining a first frequency $F_1$ and a second frequency $F_2$, means limiting the combined signal and deriving a phase modulated signal therefrom, means inverting such phase modulated signal, and gating means selecting oppositely phased outputs from such phase inverting means synchronously with abrupt change in phase to zero of the combined signal, thereby generating a new frequency $F_n$ of frequency equal to $$\frac{F_1+F_2}{2}$$

without substantial generation of spurious frequencies.

5. A frequency generator comprising means generating two frequencies $F_1$ and $F_2$ where $F_1$ is substantially equal in amplitude to $F_2$ and has a frequency at least equal to $10\,(F_2-F_1)$, means combining the two frequencies $F_1$ and $F_2$, means amplitude limiting the combined output and producing a phase modulated output of substantially constant amplitude, thereby generating a signal with phase excursions in one direction at a frequency $(F_2-F_1)$ with abrupt phase reversals, and means synchronously switching the output coincident with occurrence of such abrupt phase reversals, thereby generating a new frequency $F_n$ of a value arithmetically between $F_1$ and $F_2$.

6. In a double sideband suppressed carrier wave receiver, means producing as an output a double sideband suppressed carrier wave means limiting said wave and deriving a phase modulated signal therefrom, means inverting such phase modulated signal, and gating means selecting oppositely phase outputs from such phase inverting means synchronously with abrupt change in phase to zero of said wave, and product demodulation means deriving an audio output from said double sideband suppressed carrier wave and the gating means output.

7. In a double sideband suppressed carrier wave receiver, means receiving a double sideband suppressed carrier wave, means translating said double sideband suppressed carrier wave to an intermediate frequency wave, means limiting said intermediate frequency wave and deriving a phase modulated signal therefrom, means inverting such phase modulated signal, and gating means selecting oppositely phase outputs from such phase inverting means synchronously with abrupt change in phase to zero of the said intermediate frequency wave thus generating in the output from said gating means a reconditioned carrier at intermediate frequency, and product demodulation means deriving an audio output from the said intermediate frequency wave and said reconditioned carrier.

References Cited in the file of this patent

UNITED STATES PATENTS

| | | |
|---|---|---|
| 1,428,156 | Espenschied | Sept. 5, 1922 |
| 2,562,006 | Wheeler | July 24, 1951 |
| 2,784,311 | Kahn | Mar. 5, 1957 |